United States Patent [19]

Yousefi-Elezei

[11] Patent Number: 5,136,260
[45] Date of Patent: Aug. 4, 1992

[54] PLL CLOCK SYNTHESIZER USING CURRENT CONTROLLED RING OSCILLATOR

[75] Inventor: Nariman Yousefi-Elezei, Irvine, Calif.

[73] Assignee: Western Digital Corporation, Irvine, Calif.

[21] Appl. No.: 666,224

[22] Filed: Mar. 8, 1991

[51] Int. Cl.[5] .................. H03B 5/02; H03K 5/13; H03L 7/093; H03L 7/099
[52] U.S. Cl. .................... 331/17; 307/603; 307/605; 331/25; 331/34; 331/57
[58] Field of Search .............. 331/17, 25, 34, 57; 307/602, 603, 605

[56] References Cited

U.S. PATENT DOCUMENTS 4,988,960 1/1991 Tomisawa ................. 331/57 X
5,036,216 7/1991 Hohmann et al. ........... 331/1 R X

OTHER PUBLICATIONS

"Design of PLL-Based Clock Generation Circuits", D. K. Jeong, et al., *IEEE Journal of Solid State Circuits*, vol. SC-22, No. 2, Apr. 1987, pp. 255-261.

*Primary Examiner*—Siegfried H. Grimm
*Attorney, Agent, or Firm*—Spensley Horn Jubas & Lubitz

[57] ABSTRACT

A high frequency clock signal synthesizer circuit employs a single fixed reference clock signal to generate one or more variable frequency clock signals. A phase comparator and a variable count counter generate a control signal from the reference clock and circuit output and provide it to a voltage controlled oscillator. High frequency stability of the voltage controlled oscillator is provided by a ring oscillator with a control signal response which is linear even at high frequencies. The ring oscillator employs an odd number of inverting delay stages coupled in series in a ring configuration, each delay stage having an input, an output, an inverter coupled to the input and a controllable current source buffering the switching transistors of the inverter from the output. A bias circuit controls the current of the current source and thereby controls the delay of each delay stage and thus the frequency of the ring oscillator. The buffering of the switching transistors from the output nodes of the delay stages prevents transient effects due to parasitic capacitances and process variations from affecting the current to the output node and hence from affecting the delay of the delay stage and the frequency of the ring oscillator.

7 Claims, 5 Drawing Sheets

PLL CLOCK SYNTHESIZER USING CURRENT CONTROLLED RING OSCILLATOR

BACKGROUND OF THE INVENTION

1. Field of the Invention

The present invention relates to digital electronics. In particular, the present invention relates to clock signal synthesizer circuits, ring oscillator circuits, delay circuits and phase locked loop digital circuits.

2. Description of the Prior Art and Related Information

Circuits used to generate a high frequency periodic signal are employed in a wide variety of applications, for example, in computer, video and other applications. One example of a computer application is in a microprocessor clock generation circuit. An example of a video application is in a pixel clock generation circuit. Another video application is in a memory clock generation circuit. These two video applications may both be required in a single video graphics board. Furthermore, video graphics boards may need to be compatible with several applications, each requiring different frequency clock signals. Therefore, conventionally a large number of clock signal generation chips would be required for such a video graphics board. Also, such applications may require extremely high frequency periodic signals, for example, 14 MHz or greater. Providing such high frequency signals presents difficult stability and accuracy problems due to inherent limitations in the switching speed of the component transistors.

One approach to providing plural high frequency clock signals employs a phase locked loop (PLL) circuit and a reference clock signal to derive several clock signals from the reference clock signal See, e.g., Jeong, et al., "Design of PLL-Based Clock Generation Circuits," *IEEE J. of Sol. State Cir.*, Vol. SC-22, No. 2, Apr. 1987. A critical component of such PLL based clock signal synthesizer circuit designs, in turn, is a ring oscillator circuit which generates a periodic signal from a control current input. At very high frequencies it is often the failure of such ring oscillator circuits to provide linear response to a control current which limits the accuracy of the clock signal synthesizer circuit.

A conventional ring oscillator circuit design is illustrated schematically in FIG. 1. As shown therein, the basic construction of such a ring oscillator includes an odd number of inverting delay stages, delay stages $1_1-1_N$, arranged in series in a ring configuration. A simple tracing of a DC signal through the ring oscillator of FIG. 1 will show that a periodic signal is generated at the output, the output signal having a frequency of $\frac{1}{2}NT$, where T is the delay of each inverting stage and N is the number of stages. The delay of each stage in turn is controlled by the control signal, illustrated as dashed lines 2 in FIG. 1, which signal is typically a control current. The control current is in turn provided to each of the inverter gates $3_1-3_N$, as illustrated by the current source symbols for each stage. This control current controls the switching speed of each inverter and hence the delay of each stage $1_1-1_N$. In cases where the control current is provided by a voltage to current converter from a control voltage, the overall arrangement is referred to as a voltage controlled oscillator (VCO).

Since the ring oscillator is designed to provide a stable output frequency which varies as a function of the input control signal, it is desirable that the amount of delay be a linear function of the control signal. This linearity is approximately satisfied for conventional ring oscillator circuits at lower frequencies. As the frequency increases, however, transient effects due to the switching of the inverter gates $3_1-3_N$ introduce significant nonlinearities, rendering the amount of delay a less predictable function of the control current.

Referring to FIG. 2, a conventional delay stage 1 employs a CMOS inverter including p-channel and n-channel switching field effect transistors, 4 and 5, respectively. These switching transistors 4, 5 receive an input signal on the gates thereof provided from the preceding stage in the ring configuration. Switching transistors 4, 5 are coupled to $V_{DD}$ and ground, respectively, through transistors 6 and 7. Transistors 6, 7 are biased via diode connected p-channel and n-channel transistors 8 and 9, respectively. This configuration results in control bias voltages $V_P$ and $V_N$ applied to the gate of transistors 6 and 7, respectively, to control their respective resistances so as to mirror current I through these transistors. The magnitude of the current I through these transistors 6 and 7, in turn will control the overall delay of the stage by determining the time it takes to charge the capacitance $C_L$ of the output load (typically the parasitic capacitance of the next stage in the ring configuration). Also illustrated in FIG. 2 are the parasitic capacitance $C_{PP}$ of p-channel transistors 4 and 6 and the parasitic capacitance $C_{PN}$ of n-channel transistors 5 and 7. These parasitic p-channel and n-channel capacitances, $C_{PP}$ and $C_{PN}$, result in nonlinearity of the delay stage at high frequency operation.

More specifically, the delay of the stage will essentially be the time it takes to charge the load capacitance $C_L$ by the current I. At lower operation frequencies, the switching speed of the transistors 4, 5 will be relatively negligible relative to the charge time of the output load capacitance $C_L$ and therefore transient effects may be ignored and current I to the output treated as constant. At high frequencies, however, the transient effects become significant. In particular, the charging or discharging of the parasitic capacitances $C_{PP}$ and $C_{PN}$ cause significant fluctuations in the current flow. Hence, the time to charge $C_L$, and thus the overall delay time of the delay stage, is subject to fluctuations.

For example, as illustrated in FIG. 2, consider a transition of the input signal from $V_{DD}$ to ground. At the beginning of the transition, the voltage on the capacitor $C_L$ is 0 volts and the p-channel parasitic capacitor $C_{PP}$ is charged to $V_{DD}$. As the input transitions from $V_{DD}$ to 0, the charge on $C_L$ and the parasitic capacitance $C_{PP}$ are shared, and the rate of voltage change is initially a function of $C_L$, $C_{PP}$ and the on resistance of the p-channel transistors 4 and 6. Then, as the bias transistor 6 moves to saturation, the transistor 6 behaves like a current source with a current I set by the bias voltage $V_P$. Therefore, the delay of the stage through this transition period is a highly unpredictable and nonlinear. Since the relative effect of these parasitic capacitances increases with frequency, the amount of delay in response to a control current may be quite nonlinear at high frequencies. Additionally, these parasitic capacitances and the resistance of switching transistors are highly process dependent and hence the delay may vary strongly from batch to batch. This will in turn introduce instabilities into tee entire frequency generation circuit and make reliable generation of very high frequency clock signals impossible.

Accordingly, a need presently exists for a periodic signal generation circuit capable of reliably and accurately generating high frequency periodic signals A need further exists for a ring oscillator circuit which has a frequency which is a substantially linear function of the control current applied thereto, even at high frequencies. Additionally, a need presently exists for an improved delay stage suitable for use in such a ring oscillator or other applications where a controllable delay is required.

SUMMARY OF THE INVENTION

The present invention provides a high frequency clock signal synthesizer circuit which provides one or more variable high frequency signals having predictable frequency characteristics even at very high frequencies.

In a preferred embodiment, the present invention employs a single externally provided reference clock signal, which is used to generate one or more output signals, each having a variable frequency. The reference clock signal is provided to a phase comparator. The phase comparator compares the phase of the reference signal and the output signal of the circuit, which output has been down converted in frequency by a counter, and generates a phase lag or lead signal. The counter may be set to a variable count value N by an externally provided delay control signal and a delay control register. A charge pump establishes a control voltage from these lag and lead signals and provides the control voltage to a voltage controlled oscillator. The magnitude of this control voltage is determined by N, the divide count of the counter. By controlling the count value N, several discrete frequencies may thus be provided from a single reference clock. The voltage controlled oscillator includes a ring oscillator having a frequency characteristic which is a highly linear function of the control current, even for very high frequencies.

The ring oscillator of the present invention employs an odd number of inverting delay stages, each delay stage including an input, an output, an inverter, and a controllable current source positioned between the inverter and the output. The controllable current source buffers the output from parasitic capacitances of the switching transistors of the inverter A bias network is employed to receive an input control current and mirror the control current in the current source in each of the delay stages of the ring oscillator. The bias network includes a load matching the loads of the switching transistors in the inverters. This additional load in the bias network allows the control current to be replicated exactly in each of the delay stages. This provides a reproducible control current directly at the output to thereby control the charging of the output capacitance, and hence the delay of each stage, in a manner which is a substantially linear function of the control signal.

In a preferred CMOS embodiment each delay stage of the ring oscillator employs a CMOS inverter having an input coupled to the gates of a p-channel and an n-channel switching FET. P-channel and n-channel current source FETs are provided between the switching FETs and the output. The gates of the current source transistors are biased by a biasing network. The biasing network receives the control signal, for example, from a voltage to current converter in the case of a voltage controlled oscillator application, and biases the current source transistors to a desired current value. The biasing network includes a p-channel biasing circuit and an n-channel biasing circuit. The p-channel biasing circuit includes a p-channel load transistor and a diode connected p-channel transistor to bias the p-channel branch of the delay stage. The n-channel biasing circuit similarly includes an n-channel load transistor and a diode coupled n-channel transistor for the n-channel branch of the delay stage. This biasing network thus matches the loads in the delay stage and results in the control current being mirrored in the p-channel and n-channel branches of the delay stage, respectively. Due to the current source transistors coupled directly to the output, the effects of the parasitic capacitances of the switching transistors forming the inverter are buffered from the output during transitions. This prevents the parasitic capacitances from introducing nonlinearities into the current at the output and thus rendering the delay a nonlinear function of the control current.

Further features and advantages of the present invention will be appreciated by review of the following detailed description of the present invention.

DETAILED DESCRIPTION OF THE INVENTION

Figure 3:
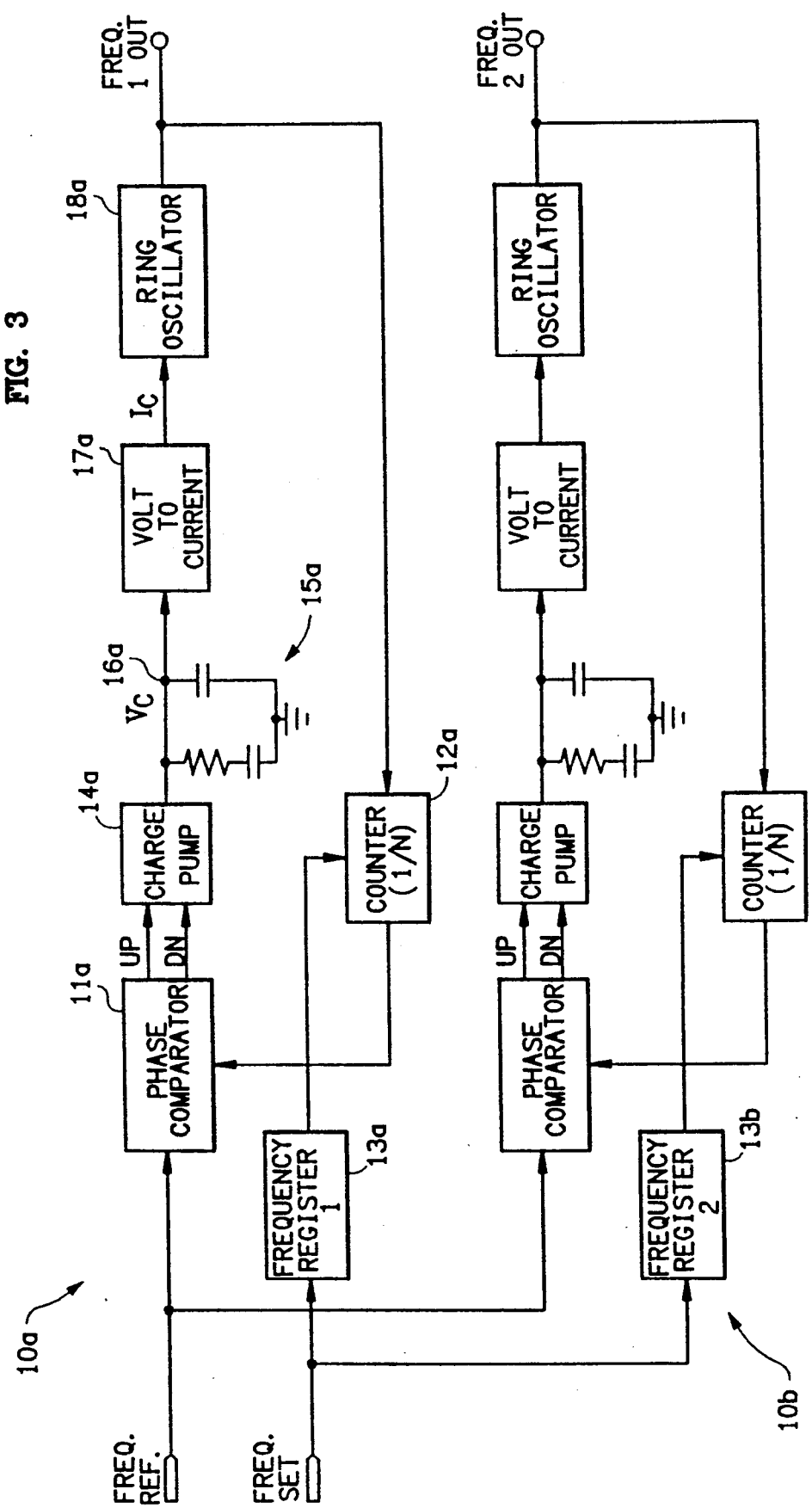
FIG. 3 is an electrical schematic drawing of a high frequency clock signal synthesizer circuit in accordance with the present invention.

Referring to FIG. 3, a preferred embodiment of the improved high frequency signal synthesizer circuit of the present invention is illustrated. As shown, the frequency synthesizer circuit employs two matching variable frequency synthesizer circuits 10a and 10b for providing output frequencies FREQ1 and FREQ2, respectively. This configuration allows two adjustable high frequency signals to be generated in a compact chip layout. For example, one preferred application is in a video graphics board where a pixel clock and a video memory clock signal may be provided as FREQ1 and FREQ2, respectively, in a compact circuit readily implemented in a single integrated circuit chip. It will be appreciated, however, that in other applications a single high frequency signal synthesizer circuit 10a may be employed. Alternatively, additional matching high frequency signal synthesizer circuits may be provided where the application requires three or more separate high frequency signals to be generated.

Referring to FIG. 3, the description of the frequency synthesizer circuit 10b follows that of 10a, so for convenience only the operation of circuit 10a will be discussed in detail. As shown, circuit 10a receives an externally provided signal REF, which may be provided by an external clock generation chip or other source of high frequency periodic signals. The circuit 10a of FIG. 3 employs a phase comparator 11a, which may be of conventional design, to phase compare the input reference signal to the output signal FREQ1, which output is circulated back from the output of the circuit through counter 12a. Counter 12a provides an adjustable down conversion in frequency by a count divide factor 1/N to signal FREQ1. The divide count factor 1/N is variable and is set by frequency register 13a which receives an externally provided frequency setting signal. For example, for an 8-bit counter 12a, the conversion factor N may be set to one of 256 different values by the frequency setting signal and frequency register 13a. These various settings in turn allow the frequency of the output signal FREQ1 to be varied in discrete frequency steps. Providing a separate register 13b in turn allows the second output signal FREQ2 to have a different frequency. Thus, two separate clock signals FREQ1 and FREQ2 may be provided, each adjustable over a wide frequency range, while only a single off chip reference clock signal REF is required. This could, for example, be employed to generate a pixel clock signal and memory clock signal in a video graphics board where different applications of the board require different clock frequencies.

The phase comparator 11a determines whether the reference frequency lags or leads the output frequency FREQ1, in the former case providing an up signal and in the latter case providing a down signal, to charge pump 14a. Charge pump 14a, in conjunction with filter 15a, stores repeated up or down signals provided from the phase comparator 11a to build up a control voltage $V_C$ at node 16a. The number of such signals and hence the magnitude of the control voltage will be determined by the count number N of counter 12a. This control voltage is in turn provided to a voltage controlled oscillator including voltage to current converter 17a and ring oscillator 18a. Converter 17a may preferably employ a Wilson current source and a conventional voltage to current converter circuit. The voltage to current converter 17a provides a control current $I_C$, corresponding to the control voltage $V_C$, to ring oscillator 18a. Ring oscillator 18a in turn provides the high frequency output signal FREQ1 which has a frequency which is a linear function of the control current $I_C$. The structure and operation of ring oscillator 18a is described in detail below with reference to FIGS. 4 and 5.

Figure 4:
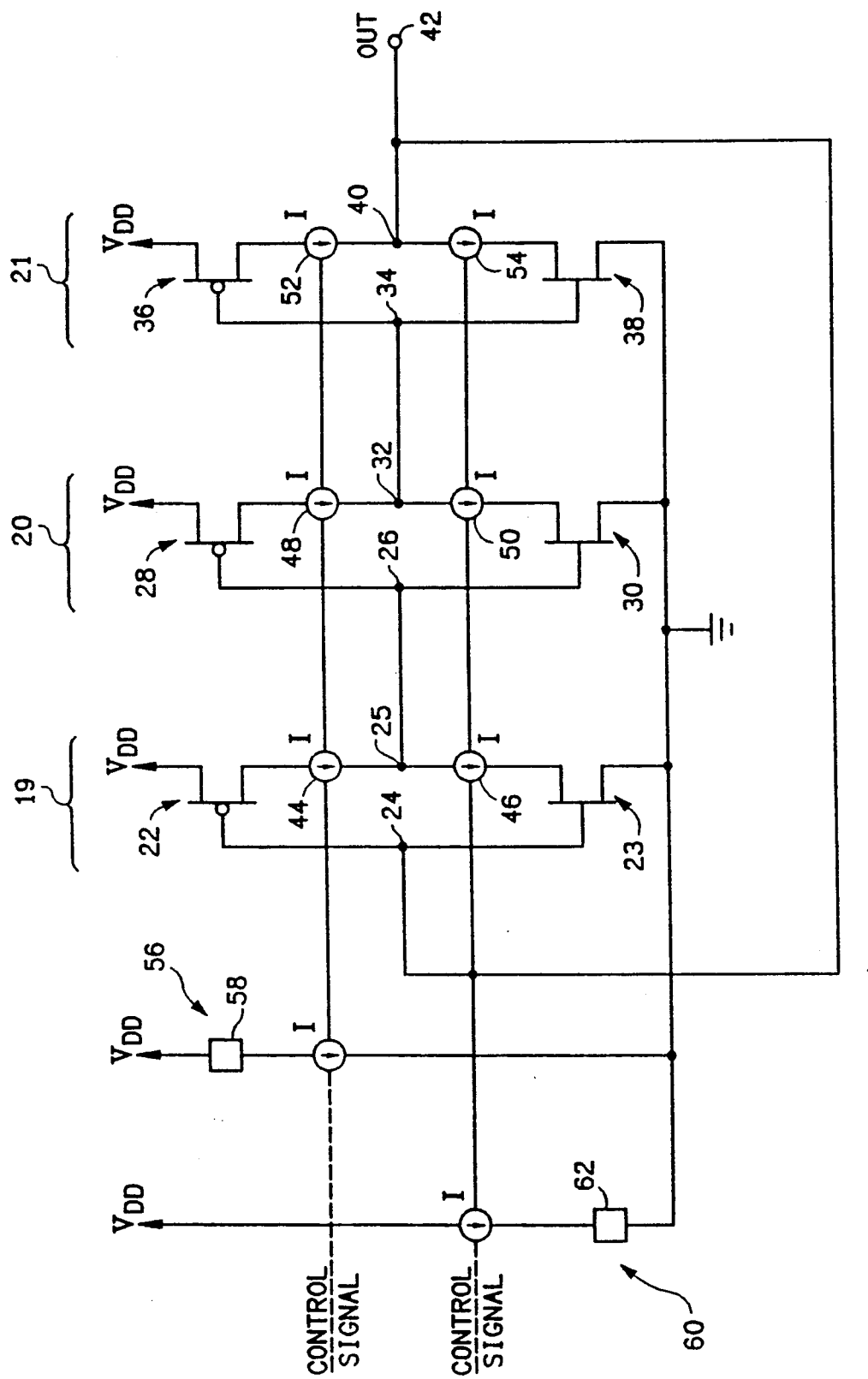
FIG. 4 is an electrical schematic drawing of a ring oscillator circuit in accordance with the present invention.

Referring to FIG. 4, a preferred embodiment of the ring oscillator circuit 18a of the present invention is illustrated in an electrical schematic form. The ring oscillator circuit 18a, as illustrated, includes three delay stages 19, 20, 21. It will be appreciated, however, that any odd number of delay stages may be employed with three delay stages being chosen merely for ease of illustration. Furthermore, it will be appreciated that the specific layout shown in FIG. 4 is illustrative only and various other configurations may be employed without departing from the present invention. For example, while the preferred embodiment illustrated in FIG. 4 is shown implemented in a complementary metal oxide semiconductor (CMOS) implementation, other implementations such as NMOS or PMOS are also possible.

Referring to FIG. 4, delay stages 19, 20, 21 each include a CMOS inverter coupled between a first reference voltage $V_{DD}$ and a second reference potential; for example, $V_{DD}$ may be +5 volts for typical CMOS applications and the second reference potential may be ground. Specifically, delay stage 19 includes a CMOS inverter formed by p-channel transistor 22 and n-channel transistor 23, coupled to $V_{DD}$ and ground, respectively. This inverter formed by the transistors 22 and 23 receives an input signal provided at input node 24 and provides an inverted signal at output node 25. The output at node 25 in turn is provided to the input node 26 of delay stage 20. Delay stage 20 similarly employs a CMOS inverter formed by p-channel transistor 28 and n-channel transistor 30 to invert the signal at input node 26 and provide the inverted signal at output node 32. Similarly, third delay stage 21 includes input node 34, an inverter formed by p-channel transistor 36 and n-channel transistor 38, and output node 40. The output signal at output node 40 is in turn coupled back to input node 24 of the first delay stage 19 to form the ring configuration. Additionally, the output at node 40 is provided to ring oscillator output 42 to provide the desired oscillating output signal. As in the case of a conventional ring oscillator, the configuration of an odd number of inverting delay stages 19, 20, 21 in a ring configuration results in an oscillating output signal having a frequency (f) of ½NT, where N is the number of stages and T is the delay of each stage. Thus, in the case of the specific three delay stage configuration of FIG. 4, the output at 42 will have a frequency of f=1/6T.

Still referring to FIG. 4, each delay stage further includes a first and second current source configured between the p and n-channel transistors making up the CMOS inverter and the output node of each stage. More specifically, first inverting delay stage 19 includes a first current source 44 and second current source 46 coupled between inverting transistors 22, 23 and output node 25. Similarly, second delay stage 20 includes a first current source 48 and second current source 50 coupled between inverting transistors 28, 30 and output node 32, and third delay stage 21 includes first and second current sources 52, 54 coupled between transistors 36, 38 and output node 40.

Each of the first current sources 44, 48 and 52 are driven by a first biasing circuit 56 which mirrors control current I at each of the delay stages. The first biasing circuit 56 includes load 58 to match the load in the p-channel legs of delay stages 19, 20 and 21. Similarly, second current sources 46, 50 and 54 are driven by a second bias circuit 60 having load 62 which matches that in the n-channel legs of each of the delay stages 19, 20 and 21. The first and second bias circuits 56, 60 thus allow control current I, established therein by externally provided control signals, to be mirrored in each of the first and second current sources 44, 46, 48, 50, 52 and 54.

As will be appreciated from inspection of FIG. 4, and as will be discussed in more detail with respect to FIG. 5, the ring oscillator of the present invention provides a stable current source between each of the switching transistors 22, 23, 28, 30, 36, 38 of the inverters of each delay stage and the respective delay stage output node. These stable current sources 44-54 provide a buffer between the output node and the transient effects associated with the switching action of the p-channel and n-channel transistors making up the inverters of each delay stage. Since the delay (T) of each stage is proportional to the current flowing through the output node thereof, it will be appreciated that the provision of a stable current I at the output node serves to establish a well defined delay. Therefore, the ring oscillator of FIG. 4 provides an oscillating signal at output 42 having a frequency which is a well defined function of the control signal.

Figure 5:
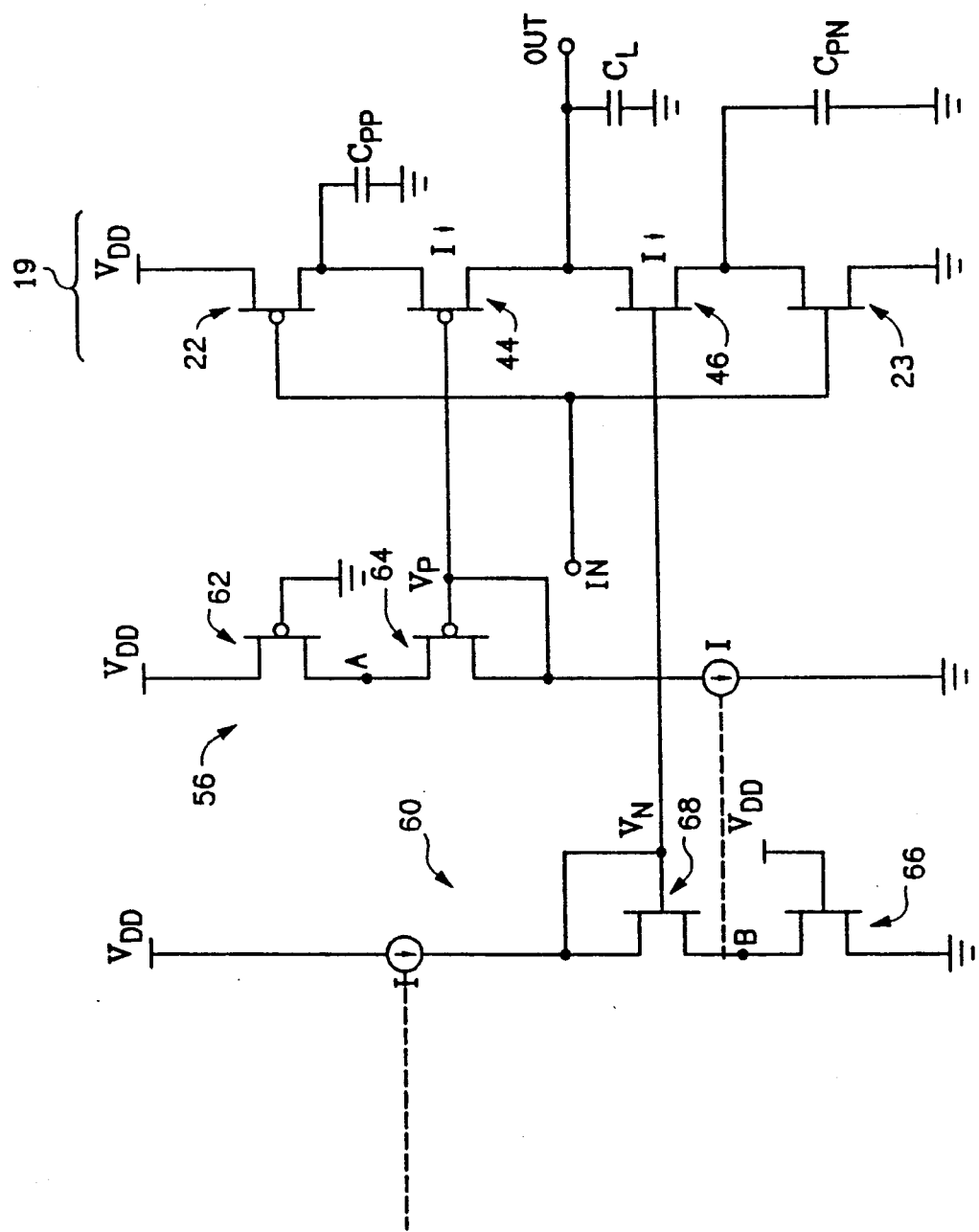
FIG. 5 is an electrical schematic drawing of a delay circuit in accordance with the present invention.

Referring to FIG. 5, a specific implementation of the biasing circuit in conjunction with a single delay stage is illustrated. For convenience of illustration, the delay stage illustrated in FIG. 5 may be taken to correspond to delay stage 19 in FIG. 4 and like numerals are used accordingly. Also, for purposes of illustration, in FIG. 5 the parasitic capacitances of various circuit elements are illustrated schematically therein.

As shown in FIG. 5, in a preferred embodiment, the first and second current sources, 44, 46, respectively, may take the form of p-channel and n-channel transistors with their gates tied to the first and second bias circuits, 56, 60, respectively. First bias circuit 56 includes a p-channel transistor 62 with its gate coupled to ground so as to mirror the load provided by p-channel switching transistor 22 when it is in an on state. First bias circuit 56 further includes a second p-channel transistor 64 in a diode coupled configuration. P-channel transistor 64 has its gate tied to the gate of p-channel transistor 44 thereby also ensuring that transistor 64 mirrors the load of current source 44. Therefore, the current I established in the first bias circuit 56 by the control signal is mirrored at transistor 44 due to the balanced loads in the bias circuit 56 and delay stage 19. Similarly, second bias circuit 60 includes an n-channel transistor 66 with its gate coupled to $V_{DD}$, transistor 66 matching n-channel switching transistor 23 in load characteristics when it is in an on state. Second bias circuit 60 also includes diode connected n-channel transistor 68 with its gate tied to n-channel transistor 46 to thereby mirror load characteristics of transistor 46. In the same way, the current I established in the second bias circuit 60 is mirrored in transistor 46 as indicated.

Also indicated in FIG. 5, are the parasitic capacitance $C_{PP}$ of the p-channel switching transistor 22, the parasitic capacitance $C_{PN}$ of the n-channel switching transistor 23 and the output load capacitance $C_L$. As may be seen, the parasitic capacitances are buffered from the output load capacitance $C_L$ by the current source transistors 44, 46. Therefore, no charge sharing occurs between parasitic capacitances $C_{PP}$, $C_{PN}$ and output load capacitance $C_L$, avoiding transient effects in the charging of the output capacitance $C_L$ by the current I. Also, the positioning of the current source transistors adjacent the output node provides a high output impedance during transitions at the input, which limits the current flow into $C_L$ to a value equal to or less than I. It will thus be appreciated that the reconfiguration of the switching inverter transistors 22, 23 outside current source transistors 44, 46 significantly increases the predictability and linearity of the delay circuit 19 in response to high frequency transitions.

The reduction in parasitic and other transient effects by the illustrated configuration of FIG. 5 may be appreciated qualitatively by considering the operation during a transition at the input node, e.g., from a 1 to 0 logic state ($V_{DD}$ to ground). At the beginning when the input is at $V_{DD}$, the output capacitance $C_L$ has been discharged to ground through the conductive n-channel transistors 46 and 23. At this time, the p-channel switching transistor 22 is off and the voltage on the p-channel parasitic capacitance is exactly equal to one threshold above the bias voltage $V_P$ applied to the gate of p-channel transistor 44. As the input makes a transition from $V_{DD}$ to ground, the p-channel switching transistor 22 begins to turn on and the parasitic capacitance thereof moves toward the power supply $V_{DD}$ until it reaches the same voltage as point A in the first bias circuit. At this time, the current source to the load capacitance $C_L$ is equal to I, as desired, and $C_L$ is charged with a time constant determined linearly by I. Also, since the p-channel current source transistor 44 always starts in the saturation region, the output impedance thereof is high at the beginning of the transition. Therefore, the charge on the p-channel parasitic capacitance $C_{PP}$ never gets shared with the charge on the output load capacitance $C_L$, due to the buffering of the saturated transistor 44. Thus, the rate of charging of the output load capacitance $C_L$ is always a function of the current in the current source transistor 44 and does not jump during a fast input transition as in conventional delay stages. Furthermore, since the parasitic capacitance is a very process dependent variable, and the capacitance of $C_L$ is user defined, the buffering provided by the saturated current source transistors 44 and 46 which serves to isolate the capacitance of $C_L$ from the capacitance of $C_{PP}$ and $C_{PN}$ allows a more controllable delay in the face of process variations.

Figure 1:
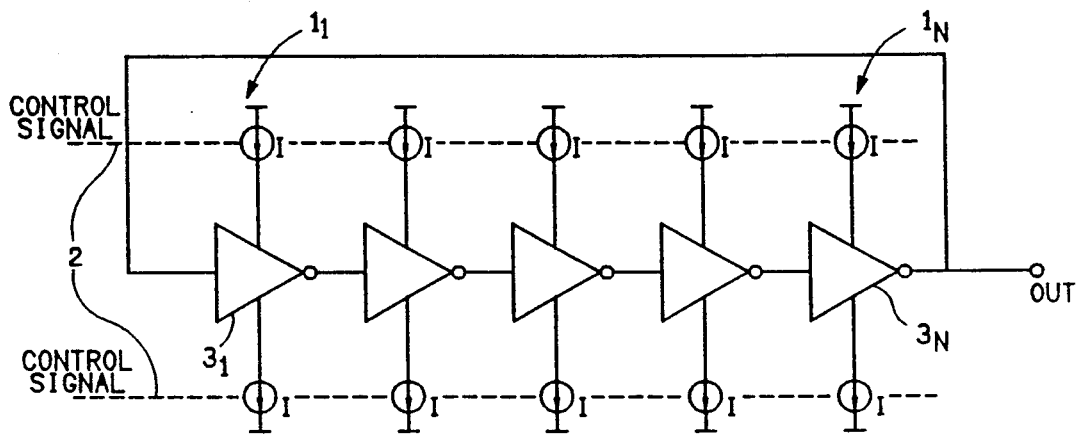
FIG. 1 is an electrical schematic drawing of a prior art ring oscillator circuit.
Figure 2:
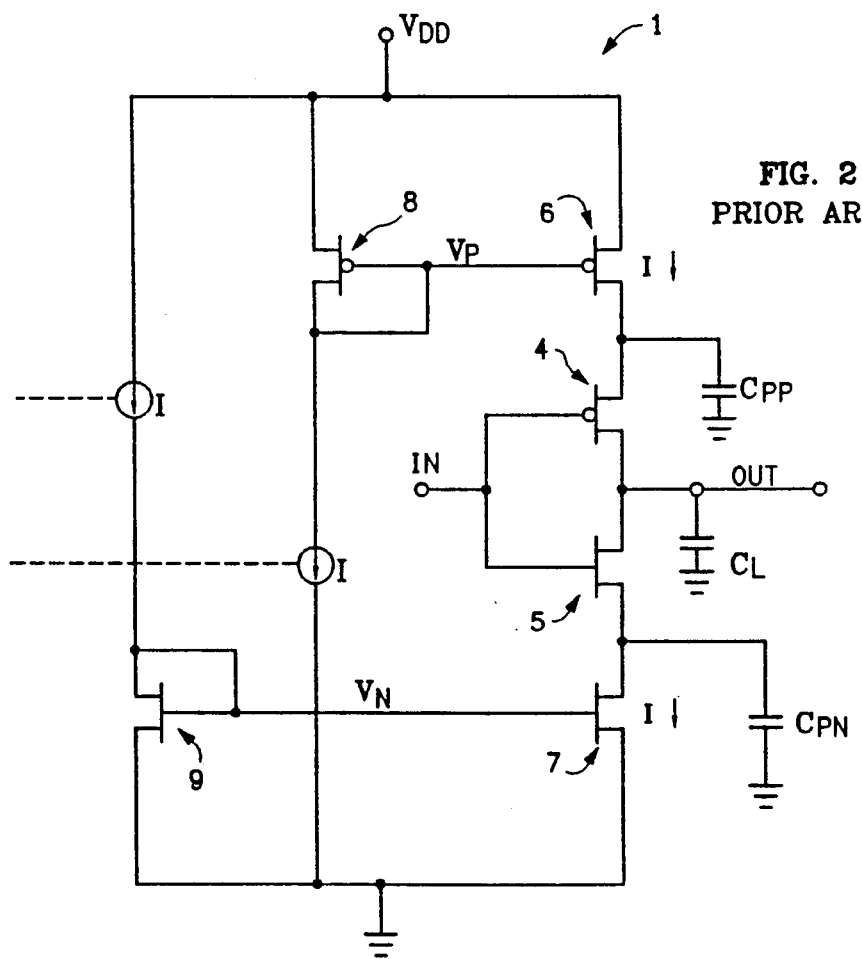
FIG. 2 is an electrical schematic drawing of a prior art delay stage such as employed in the ring oscillator circuit of FIG. 1.
Figure 6A:
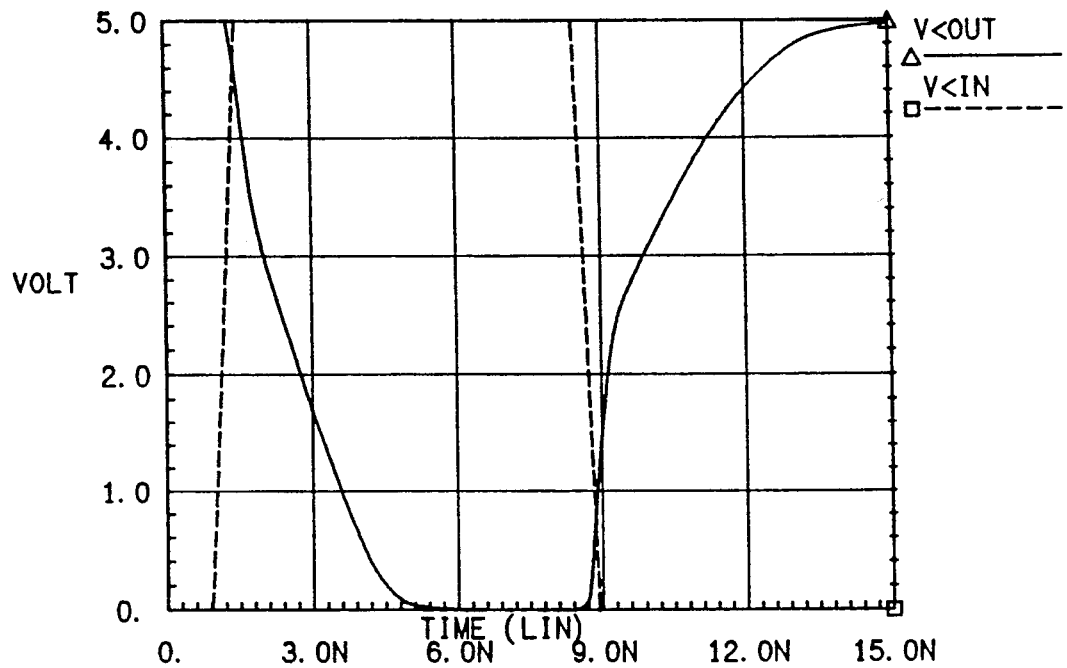
FIG. 6a is a graphical representation of the response of the prior art delay circuit of FIG. 2 to a step voltage input.
Figure 6B:
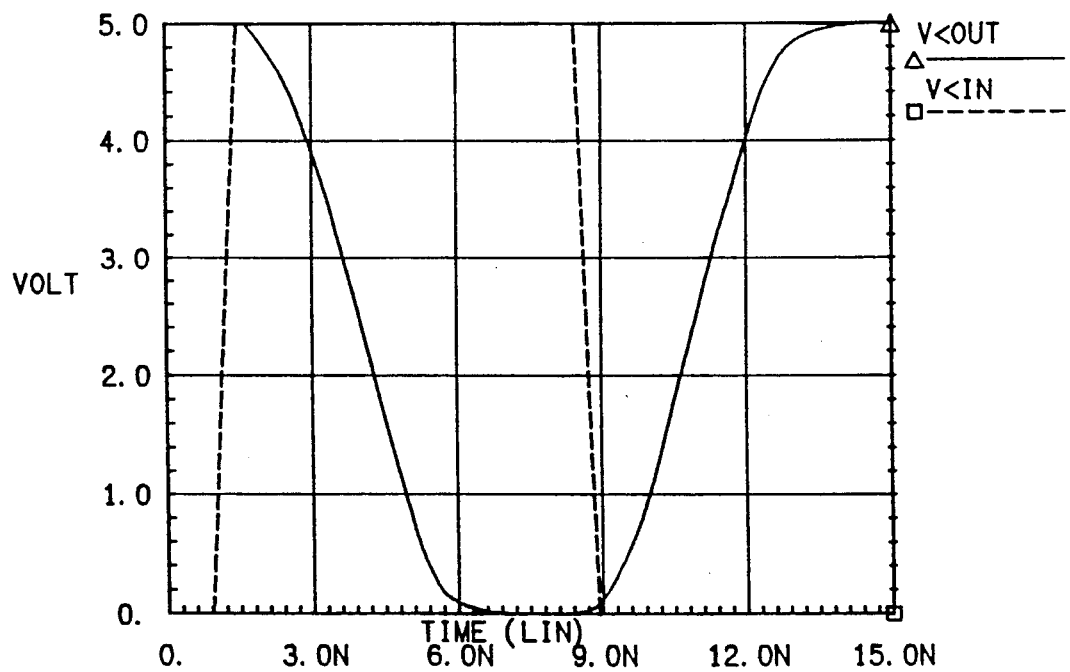
FIG. 6b is a graphical representation of the response of the delay circuit of the present invention to a step voltage input.

The foregoing qualitative advantages of the delay stage of the present invention are illustrated graphically in FIG. 6b and may be compared to a conventional delay stage illustrated in FIG. 6a. The graphs of FIGS. 6a and 6b illustrate the voltage versus time characteristics of the output node of a delay stage in response to a step transition at the input thereof. That is, at approximately 1 nanosecond (ns), the input begins a transition from 0 to 1 (ground to $V_{DD}$) then at approximately 9 ns, the input begins a sharp transition from 1 to 0 ($V_{DD}$ to ground). The graphical representations of FIG. 6a and 6b were generated by a computer simulation of the basic circuit configurations of FIGS. 2 and 5, respectively.

It will be appreciated from inspection of FIG. 6a, that the voltage at the output node of the conventional delay stage undergoes a very rapid transition during the first nanosecond after the input transition followed by a rapidly changing slope of the curve until the completion of the transition. At the $V_{DD}$ to 0 volt transition, in turn, the output also changes very rapidly during the first nanosecond or less and then the slope of the curve rapidly changes through a large range until the end of the transition. Since the current supplied to the output capacitance is proportional to dV/dt, it will be appreciated that a relatively constant charging current will require a relatively constant slope of the voltage versus time graph in response to a transition. It is quite clear from FIG. 6a, however, that the slope dV/dt varies widely through the transition resulting in an extremely variable current and hence unpredictable delay time.

Referring to FIG. 6b, it will be appreciated that the transition from 0 to +5 volts results in a very smooth curve having a relatively constant slope dV/dt through substantially the entire transition time. Similarly, from a transition from +5 volts to 0 volts, the transition is smooth and results in a substantially constant slope dV/dt. Accordingly, it will be appreciated that the present invention provides a much more constant current throughout the transition time as compared to a conventional delay stage. Accordingly, the delay time provided by the delay stage can be a relatively predictable function of the control signal and will be stable at even relatively high oscillation frequencies.

It will be appreciated that the foregoing is a description of the presently preferred embodiment of the present invention. A wide variety of modifications to the illustrated embodiment may be made to arrive at other embodiments, equally falling within the scope of the present invention.

What is claimed is:

1. A high frequency clock signal synthesizer circuit, comprising: a source of periodic reference signal;
  phase comparison means receiving said reference signal as a first input signal and receiving a second input signal, said phase comparison means comparing the phase between the two input signals and providing a first output when the first input signal leads the second input signal in phase and a second output when the first input frequency lags the second input frequency in phase;
  means, coupled to the phase comparison means, for receiving the first output signal and the second output signal and providing a first control current derived from the first output signal and the second output signal;
  means for receiving the first control current and converting the first control current to a control voltage;
  voltage to current conversion means, coupled to the means for providing a control voltage, for receiving the control voltage and providing a second control current corresponding thereto;
  ring oscillator means, coupled to the voltage to current conversion means, for receiving the second control current and providing a high frequency output signal having a frequency determined by said second control current, said ring oscillator means including an odd number of inverting delay stages and means for buffering the output thereof from transient switching characteristics to provide a substantially linear frequency response characteristic to the control current;
  means for receiving said high frequency output signal and providing a variable lower frequency signal derived from said output signal as said second input signal; and
  means, coupled to said means for providing said second input signal, for controlling the variable frequency of said second input signal.

2. A circuit as set out in claim 1, wherein said ring oscillator means further comprises a bias means for receiving the second control current and biasing the buffer means of each inverting delay stage so as to mirror the second control current therethrough.

3. A circuit as set out in claim 2, wherein each of said delay stages further comprises one or more switching transistors and wherein said bias means includes a load transistor matching the load characteristics of said switching transistors.

4. A circuit as set out in claim 1, wherein said means for providing the variable frequency second input signal comprises a variable value counter, and wherein said means for controlling determines the value of the counter.

5. A ring oscillator circuit, comprising:
  a plurality of delay stages coupled in series in a ring configuration, each delay stage comprising:
  an input node;
  an output node;
  an inverter coupled to the input node and including a switching field effect transistor coupled between a first reference voltage and a second reference voltage; and
  a controllable current source including a field effect transistor coupled between the switching transistor and the output node;
  wherein the plurality of delay stages are coupled together such that the output node of the last of the delay stages is coupled to the input node of the first of the delay stages; and
  bias means for providing a control signal to the gate of said current source field effect transistor in each of said plurality of delay stages to adjust the current through said current source field effect transistor, wherein said bias means includes a first bias transistor and a second bias transistor, having the same conductivity type as said switching field effect transistor and said current source transistor, respectively, and having matching load characteristics therewith.

6. A ring oscillator circuit, comprising:
  a plurality of delay stages coupled in series in a ring configuration, each delay stage comprising:
  an input node;
  an output node;
  an inverter coupled to the input node and including a first switching field effect transistor coupled to a first reference voltage and having the input node coupled to the gate thereof and a second switching field effect transistor coupled to a second reference voltage source and having an opposite conductivity type to said first switching transistor and having the input node coupled to the gate thereof; and
  a controllable current source including a first current supply field effect transistor having the same conductivity type as said first switching transistor and coupled between the first switching transistor and the output node and a second current source transistor having the same conductivity type as said second switching transistor and coupled between the second switching transistor and the output node;
  wherein the plurality of delay stages are coupled together such that the output node of the last of the delay stages is coupled to the input node of the first of the delay stages; and
  bias means for providing a control signal to the gate of said current source field effect transistor in each of said plurality of delay stages to adjust the current through said current source field effect transistor, wherein said bias means comprises a first bias circuit having a first bias transistor matching the first switching transistor in load characteristics and conductivity type and a second bias transistor matching the first current source transistor in load characteristics and conductivity type, and a second bias circuit including a third bias transistor matching the second switching transistor in load characteristics and conductivity type and a fourth bias transistor matching the second current source transistor in load characteristics and conductivity type.

7. A CMOS delay circuit, adapted to impart a variable delay to an input signal, comprising:
  an input node for receiving the input signal;
  an output node;
  a CMOS inverter including a p-channel field effect transistor and an n-channel field effect transistor coupled between a positive voltage source and ground wherein the p-channel and n-channel transistors receive the input signal at the gates thereof and provide an inverted signal to said output node;

a p-channel buffer transistor coupled between the p-channel inverter transistor and the output node;

an n-channel buffer transistor coupled between the inverting n-channel inverter transistor and the output node; and a bias means for providing a bias signal to said buffer transistors to control the current provided thereby and thereby control the delay of said delay circuit, said bias means including a first load matching the on resistance of the p-channel switching transistor and a second load matching the on resistance of the n-channel switching transistor.

* * * * *